United States Patent [19]

Kamuro et al.

[11] Patent Number: 4,630,295
[45] Date of Patent: Dec. 16, 1986

[54] LOW POWER CONSUMPTION CMOS SHIFT REGISTER

[75] Inventors: Setsufumi Kamuro, Yamatokoriyama; Takaaki Hirano; Mikiro Okada, both of Nara, all of Japan

[73] Assignee: Sharp Kabushiki Kaisha, Osaka, Japan

[21] Appl. No.: 633,989

[22] Filed: Jul. 24, 1984

[30] Foreign Application Priority Data

Aug. 5, 1983 [JP] Japan ................................ 58-144252

[51] Int. Cl.⁴ ...................... G11C 19/00; G11C 7/00
[52] U.S. Cl. ........................................ 377/81; 377/72; 377/73; 377/75; 377/76; 377/80; 377/107
[58] Field of Search ...................... 377/72, 73, 74, 75, 377/76, 77, 80, 81, 107; 328/129.1

[56] References Cited

U.S. PATENT DOCUMENTS

| 3,258,696 | 6/1966 | Heymann | 377/81 |
| 3,614,632 | 10/1971 | Leibowitz | 377/107 |
| 3,753,124 | 8/1973 | Graetz | 377/76 |
| 4,334,194 | 6/1982 | Rittenbach | 377/72 |
| 4,472,821 | 9/1984 | Mazin et al. | 377/80 |

Primary Examiner—John S. Heyman
Attorney, Agent, or Firm—Birch, Stewart, Kolasch and Birch

[57] ABSTRACT

A serial input/output device includes a CMOS shift register having a plurality of D-type flip-flops. A detection circuit is associated with the CMOS shift register in order to detect whether the transfer data exists in the CMOS shift register. A gate circuit is provided for applying a transfer clock signal to the CMOS shift register only when the transfer data exists in the CMOS shift register, thereby minimizing the power consumption.

4 Claims, 3 Drawing Figures

LOW POWER CONSUMPTION CMOS SHIFT REGISTER

BACKGROUND AND SUMMARY OF THE INVENTION

The present invention relates to a complementary metal oxide semiconductor (CMOS) device and, more particularly, to a serial input/output device including a CMOS shift register.

Recently, CMOS devices are used in microprocessors and microcomputers. Further, a CMOS one-chip microcomputer including a serial input/output processing device has been developed. In such a CMOS device, one of the main objects is to minimize the power consumption. In the conventional CMOS serial input/output data processing system, the power consumption is mainly caused by the data transferring operation conducted in the shift register.

Generally, the current consumption IDD in the CMOS shift register is represented as follows:

$$IDD = f \cdot CL \cdot VDD$$

where f is the operating frequency of the CMOS circuit, CL is the load capacity, and VDD is the power supply voltage. It will be clear from the above equation that the power consumption is theoretically zero when the data transfer clock signal is not applied to the CMOS circuit.

Accordingly, an object of the present invention is to provide a CMOS circuit which minimizes the power consumption.

Another object of the present invention is to minimize the power consumption in a shift register included in a CMOS serial input/output processing device.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a detection circuit is provided for detecting whether a serial transmitting data or a serial receiving data exists in a serial input/output data processing circuit. In response to a detection output of the detection circuit, a data transfer clock is applied to a data transmitting shift register or a data receiving shift register only when the transmitting data or the receiving data exists.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
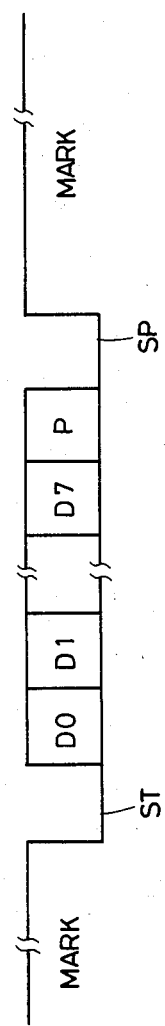
FIG. 1 is a schematic chart for explaining as asynchronous serial input/output transfer data format.

Asynchronous serial input/output data is usually represented in a format shown in FIG. 1. A mark signal bears the logic "1" as long as the data transmission is not conducted. The transfer data has the first bit functioning as a start bit ST. The data is usually of eight bits D0 through D7. The transfer data further includes a one bit parity P, and a stop bit SP. The stop bit SP is not limited to the one bit construction. Two bits or one and a half bits can be assigned to the stop bit SP.

Figure 2:
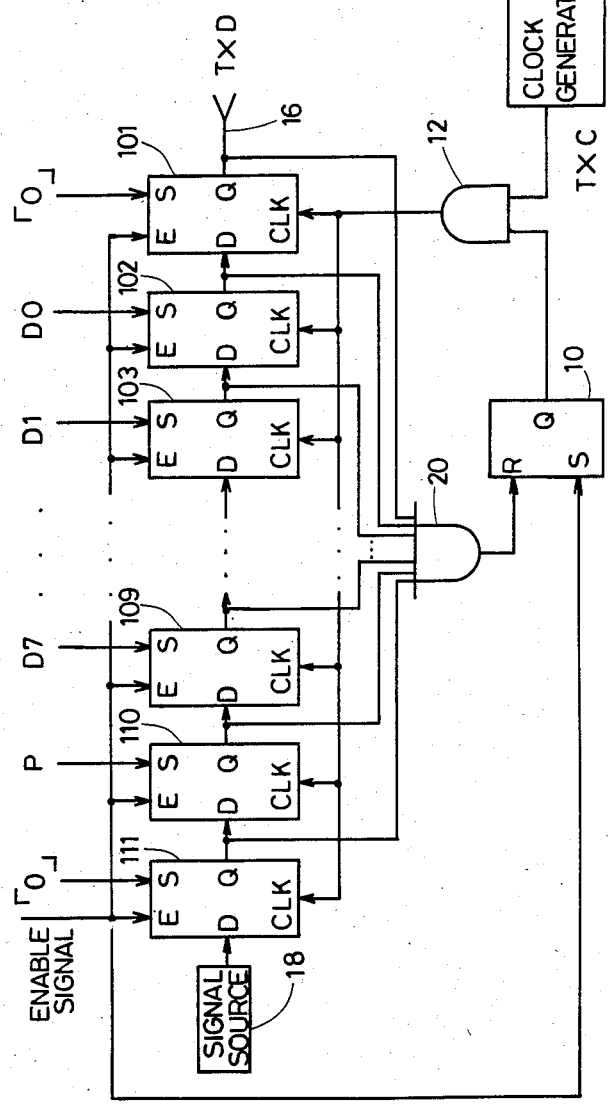
FIG. 2 is a block diagram of an embodiment of a CMOS serial output circuit included in a transmitting circuit of the present invention.

FIG. 2 shows a transmitting circuit including an embodiment of a CMOS serial output circuit of the present invention. The CMOS serial output circuit includes eleven (11) D-type flip-flops 101 through 111 to which the transfer data is written via an input terminal S in response to an enable signal applied to an enable terminal E, respectively. More specifically, the first flip-flop 101 receives the start bit ST of the logic value "0", the second through ninth flip-flops 102 through 109 receive the data D0 through D7, the tenth flip-flop 110 receives the parity P, and the last flip-flop 111 receives the stop bit SP of the logic value "0". The enable signal is also applied to a set input terminal of an RS flip-flop 10. The set output of the RS flip-flop 10 is applied to one input terminal of an AND gate 12. The other input terminal of the AND gate 12 receives a transmitting data transfer clock signal TxC developed from a transfer clock signal generator 14. That is, the data transfer clock signal TxC is applied to clock terminals CLK of the D-type flip-flops 101 through 111 in response to the development of the enable signal so that a serial transfer data TxD is developed through an output line 16.

A signal source 18 is connected to a data input terminal D of the last D-type flip-flop 111 so as to supply a signal of logic value "1" to the last D-type flip-flop 111. In this way, the transmitting data is serially developed from the first D-type flip-flop 101 in response to the data transfer clock signal TxC applied from the AND gate 12, and the signal of the logic value "1" is sequentially introduced into the D-type flip-flops from 111 through 101.

When the entire transfer data is developed through the output line 16, each D-type flip-flop 101 through 111 stores the data of logic value "1". At this moment, an AND gate 20 develops a reset signal to the RS flip-flop 10. Thus, the AND gate 12 is turned off so as not to develop the transfer clock signal TxC. That is, the transfer operation in the D-type flip-flops 101 through 111 is conducted only when the transfer data exists in the D-type flip-flops 101 through 111, thereby minimizing the power consumption.

Although in the embodiment of FIG. 2 the output signal of the RS flip-flop 10 is applied to the AND gate 12 to control the application of the transfer clock signal TxC, the output signal of the RS flip-flop 10 can be applied to the transfer clock signal generator 14 to control the generation of the data transfer clock signal TxC.

Figure 3:
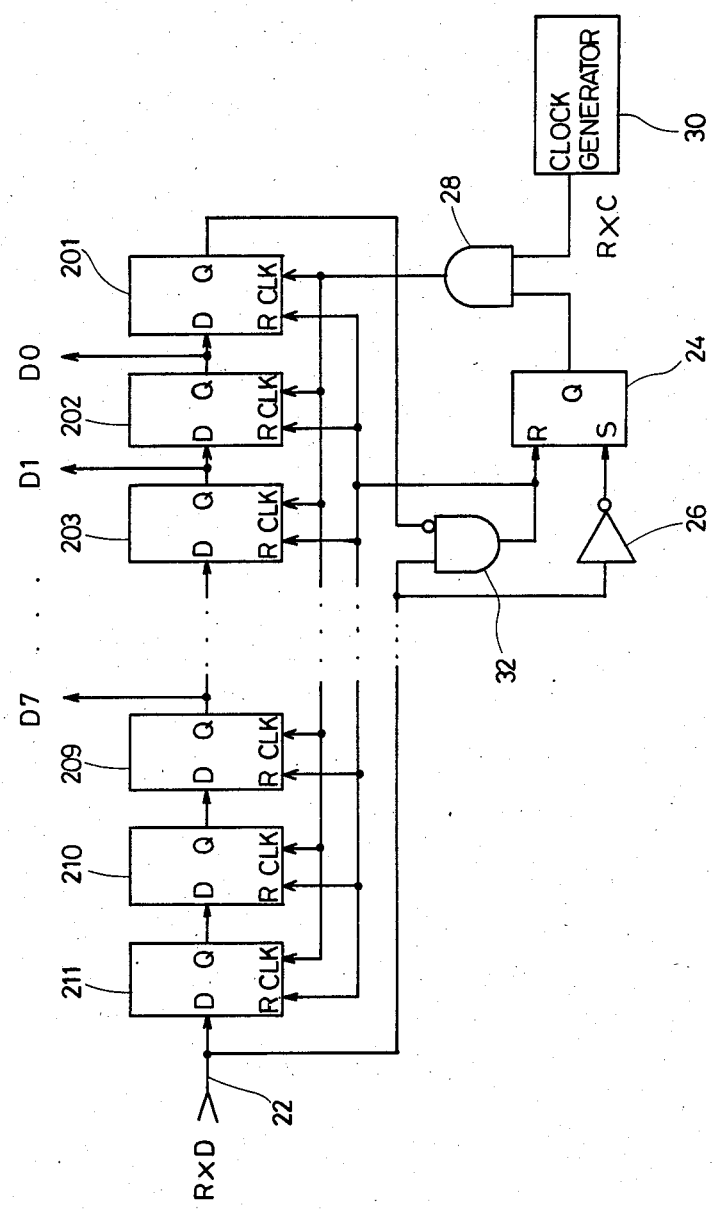
FIG. 3 is a block diagram of an embodiment of a CMOS serial input circuit included in a receiver circuit of the present invention.

FIG. 3 shows a receiver circuit including an embodiment of a CMOS serial input circuit of the present invention. The CMOS serial input circuit includes eleven (11) D-type flip-flops 201 through 211. A receiver serial data RxD is applied from an input line 22 to a data input terminal D of the D-type flip-flop 211. When the start bit ST of the logic value "0" is received, the start bit ST is applied to a set input terminal S of an RS flip-flop 24 via an inverter 26. The output signal of the RS flip-flop 24 is applied to one input terminal of an AND gate 28. The other input terminal of the AND gate 28 receives a received data transfer clock signal RxC developed from a transfer clock signal generator 30. That is, the data transfer clock signal RxC is applied to clock terminals CLK of the D-type flip-flops 201 through 211 when the RS flip-flop 24 is in the set state. The received serial data RxD is transferred in the train of the D-type flip-flops 201 through 211 in response to the received data transfer clock signal RxC applied from the AND gate 28.

When the whole of the received serial data RxD is introduced into the D-type flip-flops 201 through 211, the first flip-flop 201 stores the start bit ST of the logic value "0", the flip-flops 202 through 209 store the data D0 through D7, the flip-flop 210 stores the parity P, and the last flip-flop 211 stores the stop bit SP of the logic value "0". That is, the Q output of the D-type flip-flop 201 is the logic value "0", and the input line 22 bears the logic value "1" because of the mark signal. Therefore, an AND gate 32 develops an output signal to reset the RS flip-flop 24. The AND gate 28 is turned off so as not to supply the data transfer clock signal RxC to the D-type flip-flops 201 through 211. The data outputs of the D-type flip-flops 202 through 209 are applied to a data bus as the data D0 through D7. The output signal of the AND gate 32 is further applied to reset terminals R of the D-type flip-flops 201 through 211 so as to force the outputs of the D-type flip-flops 201 through 211 to bear the logic value "1". The data transfer clock signal RxC is applied to the D-type flip-flops 201 through 211 only during the necessary period.

The embodiment of FIG. 2 is designed as the serial output circuit in the transmitting circuit, and the embodiment of FIG. 3 is designed as the serial input circuit in the receiver circuit. However, the present invention is applicable to the serial input/output circuit if the D-type flip-flops 101 through 111, and 201 through 211 are commonly used.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A CMOS shift register system for minimizing power consumption, comprising:
   a CMOS shift register;
   detection means for providing a first signal when data meant for transfer exists in said CMOS shift register and a second signal when said shift register is full, said shift register being full being indicative that said shift register does not contain data that are to be transferred;
   transfer clock generation means for providing a clock signal so as to transfer data in said CMOS shift register; and
   means for applying said clock signal to said CMOS shift register only in response to said first signal of said detection means and inhibiting further clock signal application in response to said second signal so that power consumption is minimized.

2. A serial output device in a transmitting system for minimizing power consumption comprising:
   a CMOS shift register including a plurality of flip-flops, the last flip-flop serially developing transmitting data;
   transfer clock generation means for providing a clock signal so as to transfer data in said CMOS register;
   detection means for developing a first signal when data meant for transmission is present is said CMOS shift register and a second signal when said shift register is full which is indicative that said shift register does not contain data that is meant for transmission;
   and gate means for applying said clock signal to said CMOS shift register in response to said first signal of said detection means and inhibiting further clock signal application in response to said second signal so that power consumption is minimized.

3. The serial output device of claim 2, further comprising preset means for introducing the data meant for transmitting into said CMOS shift register in a parallel fashion.

4. A serial input device in a receiver system for minimizing power consumption comprising:
   a CMOS shift register including a plurality of flip-flops, transfer clock generation means for developing a clock signal so as to transfer data in said CMOS shift register;
   detection means for providing a first signal when the transmitted data is introduced into said first flip-flop and a second signal when said shift register is full which is indicative that no transmitted data is present in said shift register; and
   gate means for applying said clock signal to said CMOS register only when said first signal is developed from said detection means and inhibiting further clock signal application in response to said second signal so that power consumption is minimized.

* * * * *